(12) United States Patent
Muccini et al.

(10) Patent No.: US 8,729,540 B2
(45) Date of Patent: May 20, 2014

(54) ELECTROLUMINESCENT ORGANIC TRANSISTOR

(75) Inventors: Michele Muccini, Bologna (IT); Raffaella Capelli, Bologna (IT); Stefano Toffanin, Sant'Angelo di Piove di Sacco (IT)

(73) Assignee: E.T.C. S.R.L., Bologna (BO) (IT)

( * ) Notice: Subject to any disclaimer, the term of this patent is extended or adjusted under 35 U.S.C. 154(b) by 0 days.

(21) Appl. No.: 13/806,898

(22) PCT Filed: Jul. 26, 2012

(86) PCT No.: PCT/IB2012/053817
§ 371 (c)(1),
(2), (4) Date: Dec. 26, 2012

(87) PCT Pub. No.: WO2013/018002
PCT Pub. Date: Feb. 7, 2013

(65) Prior Publication Data
US 2013/0320311 A1 Dec. 5, 2013

(30) Foreign Application Priority Data
Jul. 29, 2011 (IT) .............................. MI2011A1446

(51) Int. Cl.
*H01L 51/52* (2006.01)
*H01L 51/05* (2006.01)

(52) U.S. Cl.
USPC ................. 257/40; 257/83; 257/103; 438/46; 438/99

(58) Field of Classification Search
CPC ......................... H01L 52/5296; H01L 52/5212
USPC ............................................ 257/40; 313/504
See application file for complete search history.

(56) References Cited

U.S. PATENT DOCUMENTS

| 6,720,572 | B1 | 4/2004 | Jackson et al. | |
|---|---|---|---|---|
| 2006/0188745 | A1 | 8/2006 | Liao et al. | |
| 2007/0252137 | A1* | 11/2007 | Gelinck et al. | 257/40 |
| 2008/0116450 | A1 | 5/2008 | Fong et al. | |
| 2009/0212281 | A1 | 8/2009 | Adachi et al. | |
| 2010/0283063 | A1* | 11/2010 | Imai | 257/84 |
| 2011/0215314 | A1* | 9/2011 | De Leeuw et al. | 257/40 |

FOREIGN PATENT DOCUMENTS

| EP | 1367659 | 5/2003 |
|---|---|---|
| JP | 2003100457 | 4/2003 |
| WO | 2009/099205 | 8/2009 |
| WO | 2010/049871 | 5/2010 |

OTHER PUBLICATIONS

PCT International Search Report mailed on Dec. 10, 2012 for PCT/IB2012/053817 filed on Jul. 26, 2012 in the name of E.T.C. S.P.A.

(Continued)

*Primary Examiner* — Olik Chaudhuri
*Assistant Examiner* — Christine Enad
(74) *Attorney, Agent, or Firm* — Steinfl & Bruno LLP

(57) ABSTRACT

The present invention relates to a field effect electroluminescent ambipolar organic transistor in which there are two couples of control electrodes, a layer of ambipolar organic semiconductor in direct contact with the source and the drain electrode and two separate dielectric layers, and wherein said dielectric layers are each arranged between the ambipolar organic semiconductor layer and a couple of control electrodes.

9 Claims, 1 Drawing Sheet

(56) References Cited

OTHER PUBLICATIONS

PCT Written Opinion mailed on Dec. 10, 2012 for PCT/IB2012/053817 filed on Jul. 26, 2012 in the name of E.T.C. S.P.A.
Huang, T., et al., Materials for High Performance Single-layer OLED Devices, Significant Research Achievements of Academia Sinica 2007, 13-16.
PCT International Search Report mailed on Dec. 10, 2012 for PCT/IB2012/053815 filed on Jul. 26, 2012 in the name of E.T.C. S.P.A.
PCT Written Opinion mailed on Dec. 10, 2012 for PCT/IB2012/053815 filed on Jul. 26, 2012 in the name of E.T.C. S.P.A.
Wei, B., et al., Integrating organic light-emitting diode and field-effect-transistor in a single device, Organic Electronics 2008, 9: 323-327.
Capelli, R., et al., Organic light-emitting transistors with an efficiency that outperforms the equivalent light-emitting diodes, Nature Materials 2010, 9: 496-503.
Dodabalapur, A., et al., Moelcular Orbital Energy Level Engineering in Organic Transistors, Advanced Materials 1996, 8: 853-855.

\* cited by examiner

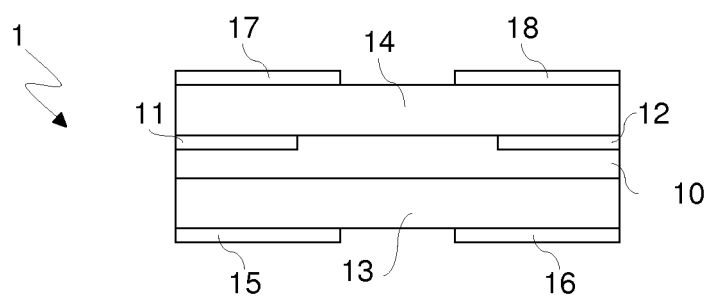

ELECTROLUMINESCENT ORGANIC TRANSISTOR

CROSS REFERENCE TO RELATED APPLICATIONS

The present application is the US national stage of International Application PCT/IB2012/053817 filed on Jul. 26, 2012 which, in turn, claims priority to Italian Application MI2011A001446 filed on Jul. 29, 2011.

The present invention relates to an electroluminescent organic transistor.

In the organic electronics field Organic Light Emitting Diodes (OLEDs) have been widely studied and many structural embodiments have been developed in order to obtain devices based on them.

The application JP2003100457 discloses some semiconductor structures suitable to be used as diodes wherein additional control electrodes can be positioned vertically with respect to the substrate of the device (i.e. with respect to the multilayer semiconductor structure) in order to improve the charge injection and transport. At first, it is evident that multi-electrodes JP2003100457 structures are limited by their complexity from the manufacturing point of view.

The scientific publication entitled "Materials for high performance single layer OLED device" by Huang et. A. published in Significant Research Achievements of Academia Sinica vol. 96 (2007) pages 13-16 discloses the possibility to substitute tri-layer semiconductor structures with a single bipolar layer, but is silent on how to overcome the performance limitations of the structures of JP2003100457 due to the vertical charge transport across the organic layer thickness.

It is known from US2009/0212281 an organic semiconductor transistor comprising an ambipolar organic semiconductor layer for the transport of electrons and holes, an electrode for the injection of the holes in the semiconductor layer, an electrode for injecting electrons in the semiconductor layer which is located at a certain distance from the first electrode, and two control electrodes separated from the organic semiconductor layer by means of an insulating layer. Of said control electrodes, one is opposed to a region of the organic semiconductor layer near the electrode for the injection of electrons and the other is opposed to the region of the organic semiconductor layer near the electrode for injection of the holes.

In the device disclosed in US2009/0212281, charge accumulation, charge transport and charge radiative recombination occur in correspondence of a single interface of the ambipolar organic semiconductor, in particular they occur at the interface between the organic semiconductor layer and the dielectric layer. This inherent feature of the known device causes the thickness of the semiconductor layer in which light is formed to be limited to a few molecular layers, thereby limiting the intensity of the light generated by the device.

Moreover, the intrinsic characteristics of the known device cause significant quenching phenomena of excitons, which are due to the interaction between said excitons and the free charges in the transistor channel, with a consequent limitation of the brightness and efficiency of the device.

It is known from application WO2010/049871 a field effect transistor comprising two dielectric layers, two control electrodes or gates, and an assembly consisting of a source electrode or source, a drain electrode or drain, and an organic semiconductor in contact with said source and drain. Such an assembly is arranged between said two dielectric layers, each of which is arranged between said assembly and a control electrode. A light emitting transistor comprising such a transistor is disclosed, wherein said organic semiconductor is an electroluminescent semiconductor organic layer with ambipolar properties.

In the light emitting transistor according to application WO2010/049871, charge transport takes place on both the interfaces between the organic semiconductor layer and the first dielectric layer and between the organic semiconductor layer and the second dielectric layer. Practically, these two interfaces have very different charge transport properties, since the molecular order of the semiconductor layer in correspondence of the two interfaces is very different.

The presence of only two control electrodes, one above and one below the semiconductor layer, limits the possibility of control of charge balancing in this device, that is an essential factor to obtain high brightness and efficiency of light emission. The objective of the present invention is therefore to provide an electroluminescent organic transistor which is improved with respect to the drawbacks of the prior art. Said objective is achieved with an electroluminescent organic transistor whose main features are specified in the first claim, while other features are specified in the remaining claims.

A first advantage of the electroluminescent organic transistor according to the present invention consists in the fact that it allows the generation of a transversal electric field with respect to the plane of the organic semiconductor layer, with radiative recombination of the charges and generation of excitons through the entire thickness of the organic semiconductor layer. Consequently, attenuation of the quenching phenomenon of the excitons is achieved, wherein said phenomenon, present in all devices having a single semiconductor layer, is due to interaction with the free charges and derives from the spatial overlap between the charges accumulated at the interface between the organic semiconductor and the dielectric layers and the excitons generated near the same interface.

A further advantage of the electroluminescent organic transistor according to the present invention consists in the fact that it allows to maximize the current density in the organic semiconductor layer, the accumulation of charge and, consequently, it allows to maximize the light intensity.

Finally, the organic transistor according to the present invention allows an optimization of the charge balancing in the device. In fact, thanks to the presence of two control electrodes on each side of the device, it allows to effectively exploit the charge transport on both interfaces of the organic semiconductor layer and to balance the differences in the mobility of the charges in the organic semiconductor layer by an appropriate modulation of the potentials of the control electrodes.

Further advantages and features of the device according to the present invention will become apparent to those skilled in the art from the following detailed and non-limiting description of an embodiment thereof with reference to the accompanying drawing in which:

FIG. 1 shows a schematic sectional view of an electroluminescent organic transistor according to the present invention.

The features of the drawing are not to scale, but their dimensions are enlarged or reduced in order to increase the clarity of the drawing.

Referring to FIG. 1, it is shown that the electroluminescent organic transistor 1 according to the present invention comprises at least one organic ambipolar semiconductor layer 10, which is suitable for the transport and the radiative recombination of charges of a first type, for example electrons, and of a second type, for example holes.

In contact with said organic ambipolar semiconductor layer 10, are arranged a source electrode 11, suitable for the injection of said charges of a first type, for example electrons, and a drain electrode 12, suitable for the injection of said charges of a second type, for example holes. The group formed by said organic ambipolar semiconductor layer 10 and said source electrodes 11 and drain 12 in contact with said layer 10 is arranged between two layers of dielectric material 13 and 14.

The electroluminescent organic transistor 1 according to the present invention also comprises a first control electrode 15 and a second control electrode 16, so that said first layer of dielectric material 13 is disposed between said layer of organic semiconductor 10 and said first and second control electrodes 15 and 16.

The electroluminescent organic transistor 1 according to the present invention further comprises a third control electrode 17 and a fourth control electrode 18, so that said second layer of dielectric material 14 is disposed between said layer of organic semiconductor 10 and said third and fourth control electrodes 17 and 18.

The source electrode 11 and the drain electrode 12 are respectively positioned defining a plane that is parallel with respect to the organic ambipolar semiconductor layer 10 (i.e. defining a plane that is perpendicular with respect to the stacking direction of the multilayer structure of the final device), in order to allow the exploitation of the field effect charge transport in correspondence of the interfaces between the organic ambipolar semiconductor layer 10 and the dielectric layers 13 and 14.

According to an embodiment of the invention, said source electrode 11 and said drain electrode 12 are on the same side of the organic semiconductor layer 10, and in other words they are both in contact with said first layer of dielectric material 13 or with said second layer of dielectric material 14.

These source and drain electrodes 11 and 12 may be arranged over a substantially flat surface of said layer of semiconductor material 10. Alternatively, these source and drain electrodes 11 and 12 may be each arranged in a suitable recess of said layer of semiconductor material 10.

In other embodiments of the invention such electrodes may be embedded within the organic semiconductor material 10, or may have the same thickness of this layer of semiconductor material 10 and be "capping" the sides of said layer.

Preferably, in the electroluminescent organic transistor according to the present invention, said source electrode 11 and said drain electrode 12 are coplanar with said layer of semiconductor material 10, or said electrodes 11 and 12 both lie on a plane parallel to a plane on which said layer of semiconductor material 10 lies.

Said organic semiconductor layer 10 may be made of any suitable material known as suitable for the ambipolar transport of charges in electroluminescent organic devices. For example suitable for use within the structures described by the present invention are oligoacenes, oligothiophenes, oligofluorenes, pyrimidine derivatives of oligothiophenes, carbonyl derivatives of oligothiophenes, α- and ω-asymmetrically substituted tetrathiophenes with alkyl chains and perfluorinated chains, oligothiophenes with thiazole core, copolymers of polyfluorene, derivatives of poly (p-phenylene-vinylene), derivatives of Poly (9,9-dioctylfluorene), derivatives of poly (9,9-dioctylfluorene-benzothiadiazole). Preferably among said materials, the one forming the semiconductor layer can be selected among the carbonyl derivatives of oligothiophenes, derivatives of fluorene and derivatives of poly (p-phenylene-vinylene).

The thickness of the semiconductor layer in the solution described by the present invention must be between 10 nm and 150 nm. In its particularly preferred embodiment, said thickness is between 40 nm and 100 nm.

Indium tin oxide (ITO), gold, copper, silver, aluminum, calcium, magnesium, chromium, iron and poly (3,4-ethylenedioxythiophene) combined with poly (styrenesulfonate) (PEDOT: PSS) can be used as a material for said source electrode 11. Preferably, the selection may be made among aluminum, calcium, magnesium, or gold.

As a material for said drain electrode 12, indium tin oxide (ITO), gold, copper, silver, aluminum, calcium, magnesium, chromium, iron and poly (3,4-ethylenedioxythiophene) combined with poly (styrenesulfonate) (PEDOT: PSS). In a particularly preferred embodiment, gold or indium tin oxide (ITO) can be used for this purpose.

The materials of the first dielectric layer 13 and the second dielectric layer 14 may be chosen from among the conventional dielectric materials for electroluminescent organic transistors. In particular, silicon dioxide, polymethylmethacrylate (PMMA), zinc oxide, alumina, zirconium dioxide, hafnium dioxide, fluoropolymers, such as for example the commercial product Cytop™, polyvinyl alcohol (PVA) and polystyrene (PS) can be used. Preferably, said layer 13 comprises two layers of zirconium dioxide and polymethyl methacrylate and said layer 14 consists of polymethylmethacrylate or Cytop™. Generally, the thickness of said dielectric layers depends on the specific material selected: purely by way of example, said layer 13, in the case it is made of zirconium dioxide and polymethylmethacrylate, the layer of zirconium dioxide has a thickness between 100 and 250 nm, while the layer of polymethylmethacrylate has a thickness between 50 and 200 nm; for said layer 14 the layer of polymethylmethacrylate or Cytop™ has a thickness between 350 and 500 nm.

The materials of the first control electrode 15 and the second control electrode 16 may be selected from indium tin oxide (ITO), gold, copper, silver, aluminum. In particular, indium tin oxide and/or gold may be preferably used.

The materials of the third control electrode 17 and the fourth control electrode 18 may be selected from indium tin oxide (ITO), gold, copper, silver, aluminum. In particular, indium tin oxide and/or gold may be preferably used.

Possible modifications and/or additions may be made by those skilled in the art to the hereinabove disclosed and illustrated embodiment while remaining within the scope of the following claims.

The invention claimed is:

1. An electroluminescent organic transistor, comprising:
   at least one layer of ambipolar organic semiconductor suitable for transport and radiative recombination of charges of a first type and of a second type;
   a source electrode suitable for injection of said charges of a first type;
   a drain electrode suitable for injection of said charges of a second type;
   said source electrode and said drain electrode being in contact with said at least one layer of ambipolar organic semiconductor;
   a first control electrode and a second control electrode;
   a first layer of dielectric material positioned between said at least one layer of ambipolar organic semiconductor and said first control electrode and said second control electrode;
   a third control electrode and a fourth control electrode; and
   a second layer of dielectric material positioned between said layer at least one layer of ambipolar organic semiconductor and said third control electrode and said fourth control electrode; wherein said source electrode and said drain electrode lie on a plane that is substantially parallel to a plane on which said at least one layer of ambipolar organic semiconductor lies.

2. The electroluminescent organic transistor according to claim 1, wherein said source electrode and said drain electrode are both in contact with said first layer of dielectric material or with said second layer of dielectric material.

3. The electroluminescent organic transistor according to claim 1, wherein a thickness of said at least one layer of ambipolar organic semiconductor is between 10 nm and 150 nm.

4. The electroluminescent organic transistor according to claim 3, wherein the thickness of said at least one layer of ambipolar organic semiconductor is between 40 nm and 100 nm.

5. The electroluminescent organic transistor according to claim 1, wherein said ambipolar organic semiconductor is selected from the group consisting of oligoacenes, oligothiophenes, oligofluorenes, pyrimidine derivatives of oligothiophenes, carbonyl derivatives of oligothiophenes, tetrathiophenes asymmetrically substituted in cc and co positions with alkyl and perfluorinated chains, oligothiophenes with thiazole core, polyfluorene copolymers, poly(p-phenylene-vinylene) derivatives, poly(9,9-dioctylfluorene) derivatives and poly(9,9-dioctylfluorene-benzothiadiazole) derivatives.

6. The electroluminescent organic transistor according to claim 5, wherein said ambipolar organic semiconductor is selected from the group consisting of carbonyl derivatives of oligothiophenes, fluorene derivatives and poly(p-phenylene-vinylene) derivatives.

7. The electroluminescent organic transistor according to claim 1, wherein said drain electrode and said source electrode are formed of a material selected from the group consisting of indium and tin oxide (ITO), gold, copper, silver, aluminum, calcium, magnesium, chromium, iron and poly(3,4-ethylenedioxythiophene) combined with poly(styrene-sulfonate) (PEDOT:PSS).

8. The electroluminescent organic transistor according to claim 1, wherein said control electrodes are formed of at least one material selected from the group consisting of indium and tin oxide (ITO), gold, copper, silver and aluminum.

9. The electroluminescent organic transistor according to claim 1, wherein said first layer of dielectric material and said second layer of dielectric material are formed of a material selected from the group consisting of silicon dioxide, polymethylmethacrylate (PMMA), zinc oxide, alumina, zirconium dioxide, hafnium dioxide, fluoropolymers, polyvinyl alcohol (PVA) and polystyrene (PS).

* * * * *